(12) United States Patent
Li et al.

(10) Patent No.: US 11,908,662 B2
(45) Date of Patent: Feb. 20, 2024

(54) DEVICE AND METHOD FOR TUNING PLASMA DISTRIBUTION USING PHASE CONTROL

(71) Applicant: Applied Materials, Inc., Santa Clara, CA (US)

(72) Inventors: Xiaopu Li, San Jose, CA (US); Kallol Bera, Fremont, CA (US); Edward P. Hammond, IV, Hillsborough, CA (US); Jonghoon Baek, San Jose, CA (US); Amit Kumar Bansal, Milpitas, CA (US); Jun Ma, San Diego, CA (US); Satoru Kobayashi, Sunnyvale, CA (US)

(73) Assignee: Applied Materials, Inc., Santa Clara, CA (US)

( * ) Notice: Subject to any disclaimer, the term of this patent is extended or adjusted under 35 U.S.C. 154(b) by 394 days.

(21) Appl. No.: 16/663,215

(22) Filed: Oct. 24, 2019

(65) Prior Publication Data

US 2020/0161093 A1 May 21, 2020

Related U.S. Application Data

(60) Provisional application No. 62/770,547, filed on Nov. 21, 2018.

(51) Int. Cl.
*H01L 21/306* (2006.01)
*C23C 16/00* (2006.01)
(Continued)

(52) U.S. Cl.
CPC ...... *H01J 37/32467* (2013.01); *C23C 16/505* (2013.01); *H01J 37/32091* (2013.01);
(Continued)

(58) Field of Classification Search
CPC ........... H01J 37/32091; H01J 37/32467; H01J 37/32174; H01J 37/32715;
(Continued)

(56) References Cited

U.S. PATENT DOCUMENTS 4,557,819 A * 12/1985 Meacham ......... H01J 37/32082
156/345.46
5,116,482 A    5/1992 Setoyama et al.
(Continued)

FOREIGN PATENT DOCUMENTS

CN     103050363 A    4/2013
EP       2190004 A2   5/2010
(Continued)

OTHER PUBLICATIONS

International Search Report and Written Opinion dated Feb. 13, 2020 for Application No. PCT/US2019/057949.
(Continued)

*Primary Examiner* — Luz L Alejandro Mulero
(74) *Attorney, Agent, or Firm* — Patterson + Sheridan, LLP; Chad M. Dougherty (57) ABSTRACT

Embodiments described herein relate to apparatus and techniques for radio frequency (RF) phase control in a process chamber. A process volume is defined in the process chamber by a faceplate electrode and a support pedestal. A grounding bowl is disposed within the process chamber about the support pedestal opposite the process volume. The grounding bowl substantially fills a volume other than the process volume below the support pedestal. A phase tuner circuit is coupled to an RF mesh disposed in the support pedestal and the faceplate electrode. The tuner circuit adjusts a phase difference between a phase of the faceplate electrode and a phase of the RF mesh.

14 Claims, 7 Drawing Sheets

(51) Int. Cl.
*H01J 37/32* (2006.01)
*C23C 16/505* (2006.01)

(52) U.S. Cl.
CPC .. *H01J 37/32174* (2013.01); *H01J 37/32715* (2013.01); *H01J 2237/24564* (2013.01); *H01J 2237/3321* (2013.01)

(58) Field of Classification Search
CPC ....... H01J 2237/24564; H01J 37/32477; H01J 37/32504
See application file for complete search history.

(56) References Cited

U.S. PATENT DOCUMENTS

| | | | |
|---|---|---|---|
| 5,314,603 A | 5/1994 | Sugiyama et al. | |
| 5,436,424 A | 7/1995 | Nakayama et al. | |
| 5,698,062 A | 12/1997 | Sakamoto et al. | |
| 5,846,332 A * | 12/1998 | Zhao | C23C 16/46 118/500 |
| 5,885,356 A * | 3/1999 | Zhao | H01L 21/68785 118/728 |
| 5,964,947 A * | 10/1999 | Zhao | C23C 16/45508 118/725 |
| 2001/0004478 A1 | 6/2001 | Zhao et al. | |
| 2004/0206309 A1* | 10/2004 | Bera | H01J 37/3266 118/728 |
| 2009/0025878 A1* | 1/2009 | Rauf | H01J 37/32082 156/345.48 |
| 2009/0236214 A1* | 9/2009 | Janakiraman | C23C 16/503 118/723 R |
| 2014/0042016 A1* | 2/2014 | Cao | C23C 14/35 204/192.15 |
| 2014/0265910 A1* | 9/2014 | Kobayashi | H01J 37/32183 315/246 |
| 2014/0302256 A1* | 10/2014 | Chen | C23C 16/46 118/500 |
| 2016/0024650 A1 | 1/2016 | Toyoda et al. | |
| 2016/0163557 A1* | 6/2016 | Hudson | H01L 21/31116 156/345.24 |
| 2017/0306494 A1 | 10/2017 | Lin et al. | |
| 2019/0115190 A1* | 4/2019 | Bingham | H01J 37/32137 |

FOREIGN PATENT DOCUMENTS

| | | |
|---|---|---|
| JP | H01201483 A | 8/1989 |
| JP | H03-107456 A | 5/1991 |
| JP | H05-205898 A | 8/1993 |
| JP | H10-237657 A | 9/1998 |
| JP | 2000188286 A | 7/2000 |
| JP | 2002302772 A | 10/2002 |
| JP | 2006156530 A | 6/2006 |
| JP | 2011124362 A | 6/2011 |
| JP | 2014533434 A | 12/2014 |
| JP | 2018066063 A | 4/2018 |
| TW | 201345322 A | 11/2013 |
| TW | 201709774 A | 3/2017 |

OTHER PUBLICATIONS

Taiwan Office Action for Application No. 108138595 dated Aug. 11, 2023.

Chinese Office Action for Application No. 201980071231.2 dated May 26, 2023.

Japan Office Action for Application No. 2021-527838 dated Nov. 7, 2023.

* cited by examiner

DEVICE AND METHOD FOR TUNING PLASMA DISTRIBUTION USING PHASE CONTROL

CROSS-REFERENCE TO RELATED APPLICATIONS

This application claims benefit of U.S. provisional patent application Ser. No. 62/770,547, filed Nov. 21, 2018, which is herein incorporated by reference in its entirety.

BACKGROUND

Field

Embodiments of the present disclosure generally relate to semiconductor processing, and more specifically to apparatus and techniques for tuning distribution of a plasma in a process chamber by controlling a phase of RF power in the process chamber.

Description of the Related Art

Chemical vapor deposition (CVD) is used to deposit a film on a substrate, such as a semiconductor substrate. CVD is generally accomplished by introducing process gasses into a process chamber that contains the substrate. The process gasses are directed through a gas distribution assembly and into a process volume in the process chamber. The gas distribution assembly is disposed in the process volume opposite the substrate which is positioned on a pedestal.

The process gasses may be energized (e.g., excited) to form a plasma in the process volume by applying radio frequency (RF) power to the process chamber. This is referred to as plasma enhanced CVD (PECVD). An RF power source may be coupled to the pedestal and to the gas distribution assembly. The RF power source provides RF power to the pedestal and to the gas distribution assembly to generate capacitively coupled plasma between the pedestal and the gas distribution assembly. However, a parasitic plasma may be generated in a lower volume of the process chamber under the pedestal. The parasitic plasma reduces the density and stability of the capacitively coupled plasma, and thus reduces the power efficiency of the PECVD chamber.

Accordingly, an improved PECVD chamber design is needed.

SUMMARY

In one embodiment, an apparatus is provided. The apparatus includes a support pedestal having a support surface. A conductive mesh is disposed in the support pedestal, and a faceplate is disposed opposite the support surface. A process volume is defined at least partially by the support pedestal and the faceplate. The apparatus further comprises an annular shaped grounding bowl, and a first portion of the grounding bowl surrounds the support pedestal opposite the process volume. An annular liner surrounds the support pedestal and at least a portion of the first portion of the grounding bowl. A phase control circuit is coupled to the faceplate and the conductive mesh.

In one embodiment, an apparatus is provided that includes a support pedestal having a support surface. A conductive mesh is disposed in the support pedestal, and a faceplate is disposed opposite the support surface. A process volume is defined at least partially by the support pedestal and the faceplate. The apparatus further comprises an annular shaped grounding bowl, and a first portion of the grounding bowl surrounds the support pedestal opposite the process volume. An annular liner surrounds the support pedestal and at least a portion of the first portion of the grounding bowl. An adjustable transformer is coupled to the conductive mesh and the faceplate.

In one embodiment, an apparatus is provided that includes a support pedestal having a support surface. A conductive mesh is disposed in the support pedestal, and a faceplate is disposed opposite the support surface. A process volume is defined at least partially by the support pedestal and the faceplate. The apparatus further comprises an annular shaped grounding bowl, and a first portion of the grounding bowl surrounds the support pedestal opposite the process volume. A second portion of the grounding bowl is disposed radially outward of the first portion of the grounding bowl. A ledge is formed into the second portion of the grounding bowl. A purge gap is formed between the first portion of the grounding bowl and the second portion of the grounding bowl adjacent to the support pedestal. An annular liner disposed on the ledge surrounds the support pedestal and at least a portion of the first portion of the grounding bowl. A phase control circuit is coupled to the faceplate and the conductive mesh.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate exemplary embodiments and are therefore not to be considered limiting of its scope, and may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Embodiments described herein relate to apparatus and techniques for radio frequency (RF) phase control in a process chamber. A process volume is defined in the process chamber by a faceplate electrode and a support pedestal. A grounding bowl is disposed within the process chamber about the support pedestal opposite the process volume. The grounding bowl substantially fills a volume below the support pedestal. A phase tuner circuit is coupled to an RF mesh disposed in the support pedestal and the faceplate electrode. The tuner circuit adjusts a phase difference between a phase of the faceplate electrode and a phase of the RF mesh.

Parasitic plasma forms in the process chamber during PECVD processing and can reduce stability of a plasma formed in a process volume of the process chamber. Furthermore, parasitic plasma reduces the power efficiency of the RF power source used to generate the plasma.

Capacitively coupled plasma is formed in the process volume between a faceplate electrode and an RF mesh disposed in a support pedestal. A volume in the process chamber, other than the process volume, is reduced to prevent parasitic plasma in the process chamber. The grounding bowl is disposed inside the process chamber and about the support pedestal to reduce the size of the volume within the process chamber other than the process volume. In one example, the volume other than the process volume is a region below the support pedestal. In another example, the volume other than the process volume is a purge gap volume adjacent to the support pedestal. In another example, the volume other than the process volume is the region below the support pedestal and/or the purge gap volume adjacent to the support pedestal.

However, the proximity of the grounding bowl to the RF mesh may reduce the plasma uniformity in the process volume. To mitigate the reduction in plasma uniformity, a tuner circuit is coupled to the faceplate electrode and/or the RF mesh. The tuner circuit controls the phase difference of the RF potential between the faceplate electrode and the RF mesh to facilitate improved plasma uniformity.

Figure 1A:
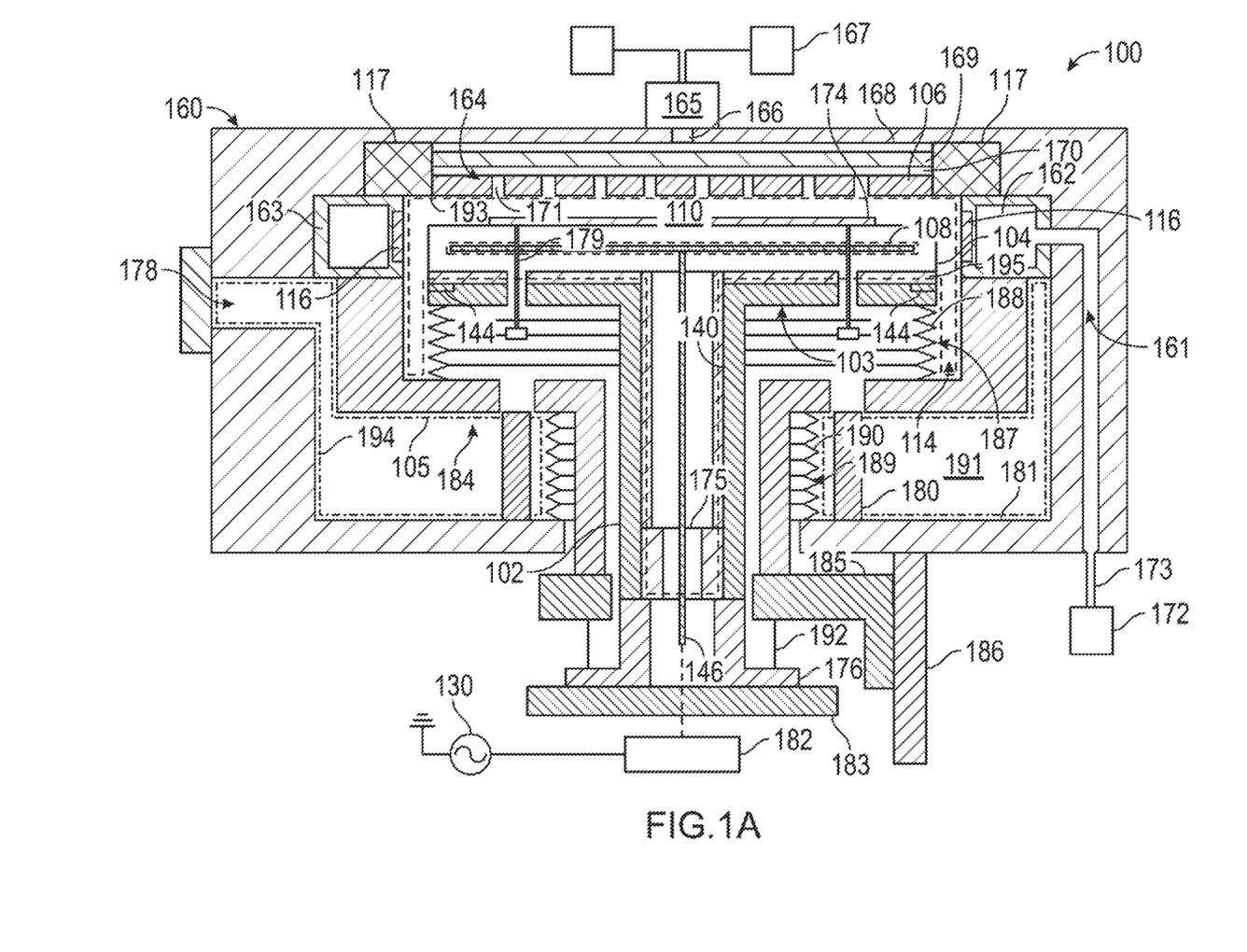
FIG. 1A is a schematic cross-sectional view of a process chamber according to one embodiment.
Figure 1B:
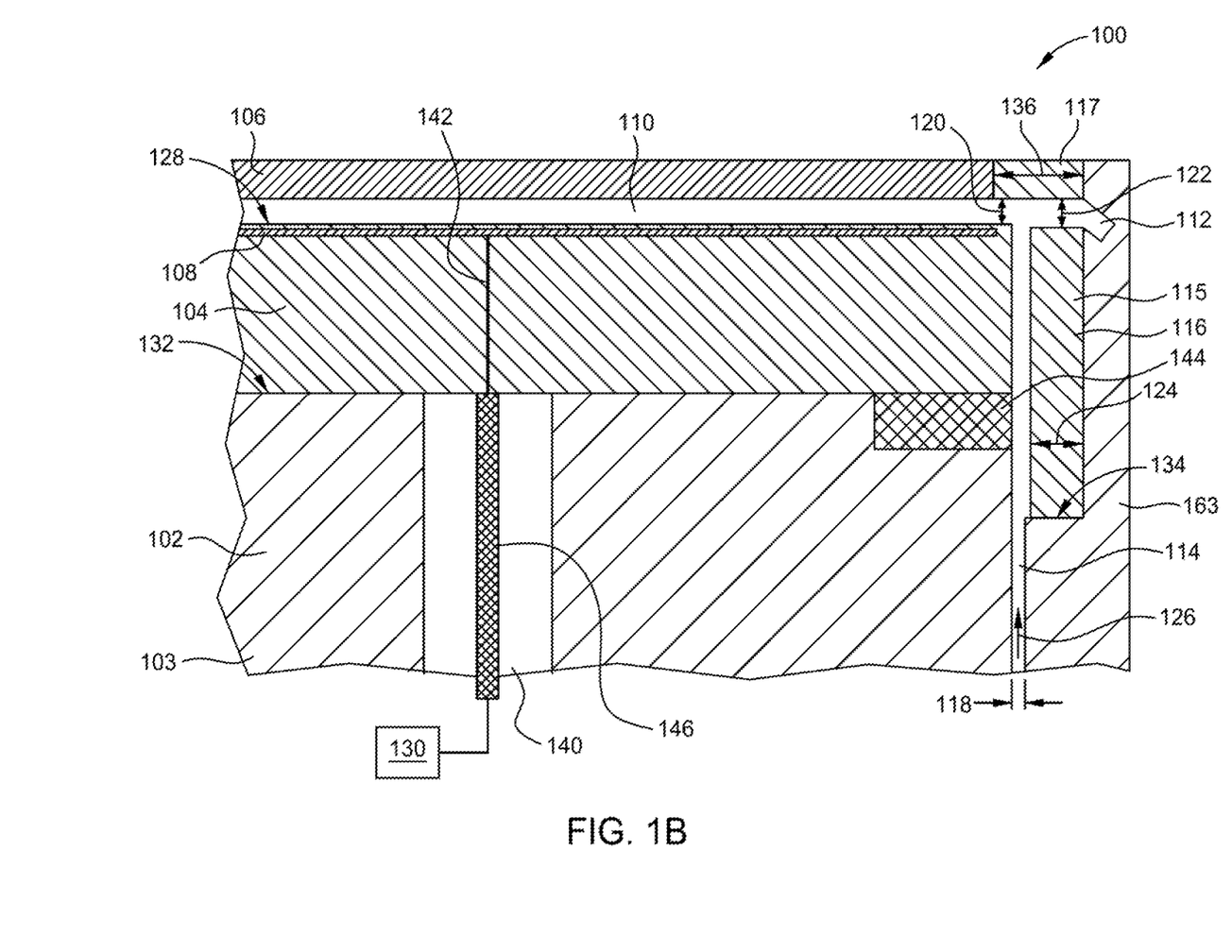
FIG. 1B is a schematic cross-sectional view of a portion of the process chamber of FIG. 1A.

FIG. 1A is a schematic cross-sectional view of a processing chamber 100 according to one embodiment, and FIG. 1B is a schematic cross-sectional view of a portion of the processing chamber 100 of FIG. 1A. In one embodiment, the process chamber 100 is used to deposit material on a substrate 174 via a process, for example, a chemical vapor deposition process. In other embodiments, the process chamber 100 can be used to perform other deposition processes. The process chamber 100 includes a chamber lid 160 and a pumping path 161. The pumping path 161 is a path formed in the process chamber 100 coupled to a pumping volume 162 formed in a pumping plate 163. A support pedestal 104 is disposed inside the process chamber 100. The support pedestal 104 includes a support surface 128 and a back surface 132 opposite the support surface 128. The support pedestal 104 is positioned on a stem 140 within the process chamber 100. The stem 140 is coupled to and extends from the support pedestal 104.

In one embodiment, the support pedestal 104 is fabricated from a ceramic material, such as aluminum nitride. A faceplate 106 is disposed inside the process chamber 100 opposite the support surface 128. The support pedestal 104 and the faceplate 106 at least partially define a process volume 110 therebetween.

An RF power source 130 provides RF power to an RF mesh 108 which at least partially facilitates generation of a plasma for processing a substrate 174 disposed on the support pedestal 104. The RF mesh 108 is disposed in the support pedestal 104 adjacent to the support surface 128. The RF power source 130 is coupled to the RF mesh 108 via a conductive rod 146 and a connector 142. The conductive rod 146 extends through the stem 140. In one embodiment, the conductive rod 146 is coaxial with a major axis of the stem 140. The conductive rod 146 is fabricated from a metallic conductive material. For example, the conductive rod 146 may be fabricated from copper alloys, stainless steel alloys, nickel alloys, molybdenum alloys, or combinations thereof. The connector 142 extends through the support pedestal 104 and is coupled to the conductive rod 146 and the RF mesh 108. In one embodiment, the connector 142 is fabricated from a metallic conductive material. Alternatively, the conductive rod 146 extends through the support pedestal 104 and is coupled to the RF mesh 108.

A grounding bowl 102 is disposed inside the process chamber 100 adjacent to the back surface 132 of the support pedestal 104. The grounding bowl 102 is electrically grounded. The grounding bowl 102 is annular shaped and surrounds the stem 140 of the support pedestal 104. In one embodiment, the grounding bowl 102 includes a first portion 103 and a second portion 105. In one embodiment, the first portion 103 of the grounding bowl 102 is adhered to the back surface 132 of the support pedestal 104 via, for example, an adhesive, such as a glue, or a weld. The first portion 103 is fabricated from a process resistant material, such as a stainless steel material. The second portion 105 may be fabricated from the same material as the first portion 103 or a different material. For example, the second portion 105 of the grounding bowl 102 is fabricated from an aluminum containing material, such as aluminum or an aluminum alloy material.

The grounding bowl 102 and the support pedestal 104 are moveably disposed in the process chamber 100. The grounding bowl 102 and the support pedestal 104 may be moved within the process chamber 100 by an actuator (not shown), such as a linear actuator, coupled to the grounding bowl 102 and the support pedestal 104. A height 120 of the process volume 110 may be adjusted by moving the grounding bowl 102 and the support pedestal 104 toward or away from the faceplate 106. For example, when the grounding bowl 102 and the support pedestal 104 are moved toward the faceplate 106, the height 120 of the process volume 110 is decreased. Conversely, when the grounding bowl 102 and the support pedestal 104 are moved away from the faceplate 106, the height 120 of the process volume 110 is increased.

A purge gap 114 is formed at least between the first portion 103 and the second portion 105 of the grounding bowl 102. The purge gap 114 extends through the grounding bowl 102 between the first portion 103 and the second portion 105. Thus, the first portion 103 and the second portion 105 at least partially define the purge gap 114. The purge gap 114 is in fluid communication with the process volume 110. A purge gas source (not shown) is in fluid communication with the purge gap 114 and provides purge gas which flows in the direction of the arrow 126 to the process chamber 100. That is, the purge gas flows through the purge gap 114 toward the process volume 110. A width 118 of the purge gap 114 between the first portion 103 and the second portion 105 is between about 100 mil and about 150 mil, for example, between about 120 mil and about 135 mil, such as about 125 mil.

A ledge 134 is formed in the second portion 105 of the grounding bowl 102. The ledge 134 is substantially parallel to the support surface 128 and substantially perpendicular to a major axis of the purge gap 114. An annular liner 115 is disposed on the ledge 134 between the purge gap 114 and the second portion 105 of the grounding bowl 102 at an end of the purge gap 114 adjacent to the process volume 110. The annular liner 115 extends adjacent to and parallel to the purge gap 114. In one embodiment, the annular liner 115 is fabricated from a ceramic material, such as an aluminum oxide material. A thickness 124 of the annular liner 115 is between about 0.25 inches and about 2.5 inches, for example, between about 0.4 inches and about 1.2 inches, such as about 0.5 inches.

A pump slot 112 is formed through the annular liner 115 and into the second portion 105 of the grounding bowl 102. The pump slot 112 is in fluid communication with the process volume 110 and the purge gap 114. An exhaust pump (not shown) is in fluid communication with the pump slot 112 to remove process gases and the purge gas from the process volume 110 and the purge gap 114.

The annular liner 115 includes a first portion 116 and a second portion 117. The first portion 116 of the annular liner 115 is disposed on the ledge 134 in the second portion 105 of the grounding bowl 102. The second portion 117 of the annular liner 115 is coplanar with the faceplate 106. The pump slot 112 passes between the first portion 116 and the second portion 117 of the annular liner 115. In one embodiment, a width 136 of the second portion 117 of the annular liner 115 is larger than the thickness 124 of the first portion 116 of the annular liner 115. For example, the second portion 117 of the annular liner 115 extends from the pump slot 112 to the faceplate 106. Thus, the second portion 117 of the annular liner 115 extends over the pump slot 112.

In one embodiment, a block 144 is disposed along a portion of the purge gap 114 opposite the annular liner 115. The block 144 is in contact with the grounding bowl 102 and the support pedestal 104. In one embodiment, the block 144 is fabricated from a metallic material. In one embodiment, the block 144 is fabricated from the same material as the grounding bowl 102. In one embodiment, the block 144 is fabricated from a material different than the material of the grounding bowl 102. For example, the block 144 may be fabricated from a stainless steel containing material.

The chamber lid 160 of the process chamber 100 includes a gas distribution assembly 164, of which faceplate 106 is part. A gas inlet passage 166 is formed in the chamber lid 160 to facilitate introduction of process gases. The gas manifold 165 receives the flow of gases from one or more gas sources 167. The flow of gases distributes across a gas box 168, flows through a plurality of holes (not shown) of a backing plate 169, and further distributes across a plenum 170 defined by the backing plate 169 and a faceplate 106. The flow of gases then flows into the process volume 110 through a plurality of holes 171 of the faceplate 106. A pump 172 is connected to the pumping path 161 by a conduit 173 to control the pressure within the process volume 110 and to the exhaust gases and byproducts from the process volume 110 through the pumping path 161.

The support pedestal 104 includes a heating element (not shown) The support pedestal 104 is movably disposed in the process volume 110 by the stem 140 coupled to a heater clamp 175. The heater clamp 175 is coupled to a cooling hub 176. The cooling hub 176 is connected to a lift system 183 that moves the support pedestal 104 between an elevated processing position and a lowered position. Movement of the support pedestal 104 facilitates transfer of the substrate 174 to and from the process volume 110 through a slit valve 178 formed in the process chamber 100. The support pedestal 104 has holes disposed therethrough, through which a plurality of lift pins 179 are movably disposed. In the lowered position, the plurality of lift pins 179 are projected from the support pedestal 104 by contacting a lift plate 180 coupled to a bottom 181 of the chamber body. Projection of the lift pins 179 places the substrate 174 in a spaced-apart relation from the pedestal to facilitate the transfer of the substrate 174.

The RF power source 130 is coupled to the RF mesh 108 disposed within the support pedestal 104 through a RF matching circuit 182. The RF matching circuit 182 is electrically coupled to the RF mesh 108 by the conductive rod 146 disposed through the cooling hub 176 and stem 140. The faceplate 106, which may be grounded via the ground path system 184, and the RF mesh 108 facilitate formation of a capacitive plasma coupling. The RF power source 130 provides RF energy to the support pedestal 104 to facilitate generation of a capacitive coupled plasma, also known as a main plasma, between the support pedestal 104 and the faceplate 106 of the gas distribution assembly 164. When RF power is supplied to the RF mesh 108, an electric field is generated between the faceplate 106 and support pedestal 104 such that atoms of gases present in the process volume 110 between the support pedestal 104 and the faceplate 106 are ionized and release electrons. The ionized atoms accelerated to the support pedestal 104 to facilitate film formation on the substrate 174.

The ground path system 184 provides a short and symmetrical path for RF energy to propagate from the faceplate 106 to the RF matching circuit 182 to reduce generation of the parasitic plasma, and thus increase deposition rate and improve film uniformity. The ground path system 184 includes the grounding bowl 102 comprising the first portion 103 and the second portion 105. The grounding bowl 102 is coupled to the stem 140 and the support pedestal 104 by a thermal barrier 195. The thermal barrier 195 provides a barrier to the support pedestal 104 that may be heated up to a temperature greater than about 700° C. The thermal barrier 195 includes materials having a low thermal conductivity. In one embodiment, which can be combined with other embodiments described herein, the thermal barrier 195 includes one or more of inconel, quartz, aluminum oxide, aluminum nitride, and stainless steel containing materials to provide a barrier to the temperature.

The grounding bowl 102 is also coupled to the cooling hub 176 that is connected to the lift system 183. The lift system 183 moves the grounding bowl 102 between the elevated processing position and the lowered position, facilitating transfer of the substrate 174. The grounding bowl 102 includes conductive materials capable of withstanding a temperature greater than about 700° C. In one embodiment, which can be combined with other embodiments described herein, the grounding bowl 102 includes one or more of inconel, aluminum, and stainless steel containing materials. The second portion 105 is coupled to a second portion carrier 185. The second portion carrier 185 is coupled to a track 186. The second portion carrier 185 is actuated to move linearly along the track 186 to move the second portion 105 between a ground position and a transfer position. The track 186 may also be a rail or cable. The second portion carrier 185 includes conductive materials capable of withstanding the temperature and process environment in the process volume 110. In one embodiment, which can be combined with other embodiments described herein, the second portion 105 includes one or more of inconel, aluminum, and stainless steel containing materials.

The first portion 103 of the grounding bowl 102 is coupled to the second portion 105 via the grounding bowl conductor 187. The grounding bowl conductor 187 is in an expanded state when the support pedestal 104 and grounding bowl 102 are in the elevated processing position and a compressed state when the support pedestal 104 and grounding bowl 102 are in the lowered position. The grounding bowl conductor 187 in the expanded state provides a path for RF energy to propagate. The grounding bowl conductor 187 includes conductive materials capable of withstanding the temperature and process environment in the process volume 110. In one embodiment, which can be combined with other embodiments described herein, the grounding bowl conductor 187 includes one or more of nickel-based alloy (e.g., HAYNES® 230® alloy), inconel, and stainless steel containing materials. In another embodiment, which can be combined with other embodiments described herein, the grounding bowl conductor 187 includes a plurality of bellows 188 that expand in the expanded state and compress in the compressed state.

The second portion 105 is coupled to the bottom 181 of the process chamber 100 via the second portion conductor 189. The second portion conductor 189 is in the expanded state when the second portion 105 is in the ground position and the compressed state when the second portion 105 is in the transfer position. The second portion conductor 189 in the expanded state provides a path for RF energy to propagate. The second portion conductor 189 includes conductive materials capable of withstanding the temperature and process environment in the process volume 110. In one embodiment, which can be combined with other embodiments described herein, the grounding bowl conductor 187 includes one or more of nickel-base alloy (e.g., HAYNES® 230® alloy), inconel, and stainless steel containing materials. In another embodiment, which can be combined with other embodiments described herein, the second portion conductor 189 includes a plurality of bellows 190 that expand in the expanded state and compress in the compressed state. The cooling hub 176 is coupled to the second portion carrier 185 by a plurality of bellows 192 to maintain the pressure within process volume 110.

The grounding bowl 102 in the lowered position and the second portion 105 in the transfer position facilitate transfer of the substrate 174 to and from the process volume 110 through a slit valve 178 formed though the process chamber 100.

The second portion 105 in the ground position contacts the pumping plate 163 to complete a primary RF cage 193 for RF energy to propagate from the faceplate 106 to the RF matching circuit 182. RF energy propagates along the primary RF cage 193 from the faceplate 106 to the pumping plate 163, from the second portion 105 to the grounding bowl conductor 187, from the grounding bowl conductor 187 to the first portion 103, and from the first portion to the conductive rod 146. The primary RF cage 193, formed by the second portion 105 in the ground position contacting the pumping plate 163, utilizes the reduced surface area to enable a shorter and more controlled ground path so that parasitic plasma is not generated underneath the support pedestal 104. Therefore, the concentration of the capacitive coupled plasma is increased, and thus the density of the capacitive coupled plasma is increased, which increases the deposition rate of the film. Furthermore, the primary RF cage 193 is substantially symmetrical to improve the uniformity of the capacitive coupled plasma to improve the uniformity of the deposited film.

Additionally, the second portion 105 in the ground position forms a secondary RF cage 194 in the outer volume 191 if the second portion 105 in the ground position does not contact the pumping plate 163. The secondary RF cage 194 provides containment of RF energy. In the outer volume 191, RF energy propagates along the secondary RF cage 194 to the second portion conductor 189, from the second portion conductor 189 to the second portion 105, and from the second portion 105 to the primary RF cage 193.

The grounding bowl 102 substantially fills a volume in the process chamber 100 below the support pedestal 104. That is, the grounding bowl 102 substantially reduces an area within the process chamber 100 within which a parasitic plasma can form. Thus, the grounding bowl 102 reduces an occurrence of parasitic plasma within the process chamber 100.

To achieve various processing conditions within the process chamber 100, a height 120 of the process volume 110 is adjusted by moving the grounding bowl 102 and the support pedestal 104 toward the faceplate 106 or away from the faceplate 106. The height 120 of the process volume 110 may be different than a height 122 of the pump slot 112. When the height 120 of the process volume 110 is reduced, a distance between the faceplate 106 and the RF mesh 108 is also reduced. The reduced distance between the faceplate 106 and the RF mesh 108 increases an electric field in the process volume 110 which causes an increased plasma density near an outer edge of the support pedestal 104. Thus, the reduced distance causes a reduction in plasma uniformity in the process volume 110.

Further, efficiency of the RF power is reduced when there is a center-low plasma distribution in the process volume, for example, where the plasma is formed adjacent to the support pedestal 104. Thus, a reduced height 120 of the process volume 110 increases stability of the plasma and reduces an occurrence of parasitic plasma forming within the process chamber 100. However, the reduced height 120 decreases the plasma uniformity and decreases the efficiency of the RF power.

To reduce the potential for parasitic plasma formation and increase the plasma uniformity within the process chamber 100, a tuner circuit is coupled to various components in the process chamber. The tuner circuit is discussed in detail with respect to FIGS. 2A, 2B, and 2C below. The tuner circuits described below may be used in place of, or in addition to, aspects of process chamber 100. For example, aspects of the tuning circuits described herein may be used in combination with, or replace, the RF matching circuit 182 and the RF power source 130 of FIG. 1A.

Figure 2A:
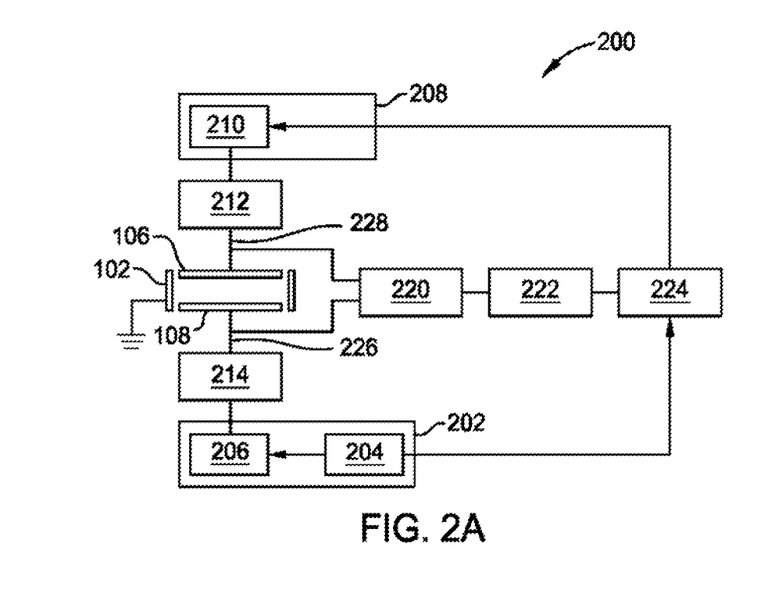
FIG. 2A is a schematic diagram of a tuner circuit according to one embodiment.

FIG. 2A is a schematic diagram of a phase control circuit 200 powering the faceplate 106 according to one embodiment. The phase control circuit 200 includes a first generator 202, a second generator 208, a phase detector 220, a feedback controller 222, and a phase shifter 224. The first generator 202 includes an oscillator 204 and a first RF power amplifier 206 coupled to the oscillator 204. The second generator 208 includes a second RF power amplifier 210. The oscillator 204 produces radio frequency (RF) signals with a frequency between about 4 MHz and about 20 MHz, for example between about 8 MHz and about 15 MHz, such as about 13.56 MHz.

A frequency of the first RF power amplifier 206 is substantially the same as a frequency of the second RF power amplifier 210. The first RF power amplifier 206 is coupled to the RF mesh 108 through a first RF impedance match circuit 214 and a first connection 226. The second RF power amplifier 210 is coupled to the faceplate 106 through a second impedance match circuit 212 and a second connection 228. An output frequency of the first RF power amplifier 206 is substantially the same as an output frequency of the second RF power amplifier 210.

Inputs of the phase detector 220 are coupled to the first connection 226 and the second connection 228. The phase detector 220 detects the phase of the RF power of the first generator 202 and the second generator 208. The phase detector transmits the detected phases to the feedback controller 222. In one embodiment, the feedback controller 222 includes a phase comparator (not shown). The phase comparator converts an output of the phase detector 220 to a signal compatible with the phase shifter 224. For example, the output signal of the phase detector 220 may be a sine-wave. If an input of the phase shifter 224 is a square-wave, the phase comparator converts the sine-wave output of the phase detector 220 to a square wave.

The phase comparator of the feedback controller 222 also determines a phase difference between the phase of the first generator 202 and the second generator 208. In one embodiment, the feedback controller 222 also determines a desired phase difference to improve uniformity of the plasma generated in the process volume 110 (illustrated in FIG. 1). The feedback controller 222 transmits the desired phase difference and the phase difference between the generators 202 and 208 to the phase shifter 224.

If the phase difference is less than desired phase difference, the phase shifter 224 increases the phase of the second generator 208. If the phase difference is greater than the desired phase difference, the phase shifter 224 decreases the phase of the second generator 208. Thus, the phase shifter 224 modulates the second RF power amplifier 210 to achieve the desired phase difference. In one embodiment, the desired phase difference is between about 125° and about 225°. The desired phase difference between the faceplate 106 and the RF mesh 108 may depend on chemistries involved in processing of a substrate 174 in the process volume 110. Modulating the phase of the second RF power amplifier 210 improves a uniformity of the plasma in the process volume 110 and reduces an occurrence of parasitic plasma in the purge gap 114 and the pump slot 112 (illustrated in FIG. 1).

In one embodiment, phases of the RF power amplifiers 206 and 210 are phase locked. That is, a phase of the second RF power amplifier 210 is directly proportional to a phase of the first RF power amplifier 206. The phase control circuit 200 enables the RF power amplifiers 206 and 210 to be phase locked.

In operation, the phase control circuit 200 continuously detects the phase difference between the faceplate 106 and the RF mesh 108 and shifts a phase of the second RF power amplifier 210 to achieve the desired phase difference.

Figure 2B:
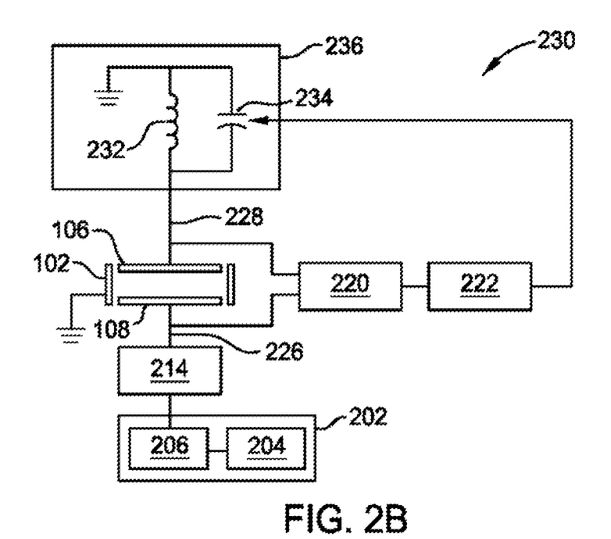
FIG. 2B is a schematic diagram of a tuner circuit according to one embodiment.

FIG. 2B is a schematic diagram of a tuner circuit 230 with a passively floated the faceplate 106 according to one embodiment. The faceplate 106 is "floated" because, while the faceplate 106 is connected to a common electrical ground, the faceplate 106 is not physically connected to the Earth. The tuner circuit 230 includes a faceplate tuner 236 which includes a variable capacitor 234 and an inductor 232 in parallel. The variable capacitor 234 and the inductor 232 are coupled to the faceplate 106. An impedance of the faceplate tuner 236 produces a shift in phase and voltage of the faceplate 106 with respect to the phase and voltage of the first generator 202. Thus, the faceplate tuner 236 produces a phase difference between the faceplate 106 and the RF mesh 108.

The phase detector 220 is coupled to the connections 226 and 228. In operation, the phase detector 220 detects a phase of the faceplate 106 via the second connection 228 and a phase of the RF mesh 108 via the first connection 226. The phase detector 220 transmits the detected phases to the feedback controller 222. The feedback controller 222 determines a phase difference between the detected phases. The feedback controller 222 determines a change in the phase of the faceplate 106 to achieve the desired phase difference between the faceplate 106 and the RF mesh 108.

The feedback controller 222 determines a capacitance value of the variable capacitor 234 that achieves the desired phase difference based on the change in phase. The feedback controller 222 adjusts the capacitance of the variable capacitor 234 to the determined capacitance value. The tuner circuit 230 continuously monitors the phase difference between the faceplate 106 and the RF mesh 108 and adjusts the capacitance of the variable capacitor 234 to achieve the desired phase difference. The faceplate tuner 236 electrically floats the faceplate 106 with respect to ground.

A single power generator (e.g., the first generator 202) is used in the embodiment illustrated in FIG. 2B. The single power generator provides a single frequency to the tuner circuit 230 such that a frequency of the RF mesh 108 and a frequency of the faceplate 106 are substantially the same. Thus, the single generator decreases an occurrence of different frequencies between the faceplate 106 and the RF mesh 108. Advantageously, a cost to implement the tuner circuit 230 is less than a cost to implement, for example, a tuner circuit with two power generators because a single power generator is utilized as opposed to multiple power generators.

Figure 2C:
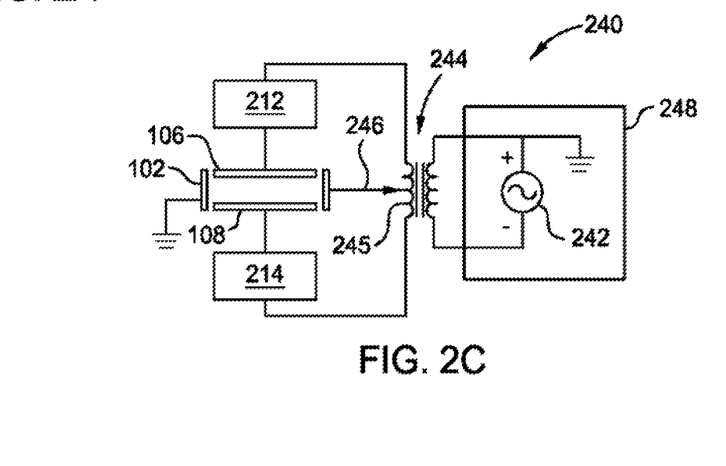
FIG. 2C is a schematic diagram of a tuner circuit according to one embodiment.

FIG. 2C is a schematic diagram of a tuner circuit 240 according to one embodiment. The tuner circuit 240 includes a power generator 248 and a RF transformer 244. The power generator 248 includes an RF power source 242. The RF transformer 244 is coupled to the grounding bowl 102 in the process chamber (illustrated in FIG. 1) via a connector 246. The connector 246 is coupled to an adjustable pin on a secondary winding 245 of the RF transformer 244.

The RF transformer 244 splits the RF power from the RF power source 242 into two power signals. A first power signal is transmitted to the faceplate 106 and a second power signal is transmitted to the RF mesh 108. A phase of the first power signal is opposite (e.g., about 180°) a phase of the second power signal. Thus, the RF transformer 244 creates a phase difference between the faceplate 106 and the RF mesh 108. To adjust a phase difference and a voltage between the faceplate 106 and the RF mesh 108, the adjustable pin can be moved on the secondary winding 245 of the RF transformer 244.

Advantageously, a single power generator (e.g., the power generator 248) provides power to the tuner circuit 240. Thus, a frequency of the faceplate 106 and a frequency of the RF mesh 108 are substantially the same. Further, the single power generator reduces a cost to implement the tuner circuit 240 with respect to a tuner circuit which includes two or more power generators.

Figure 3A:
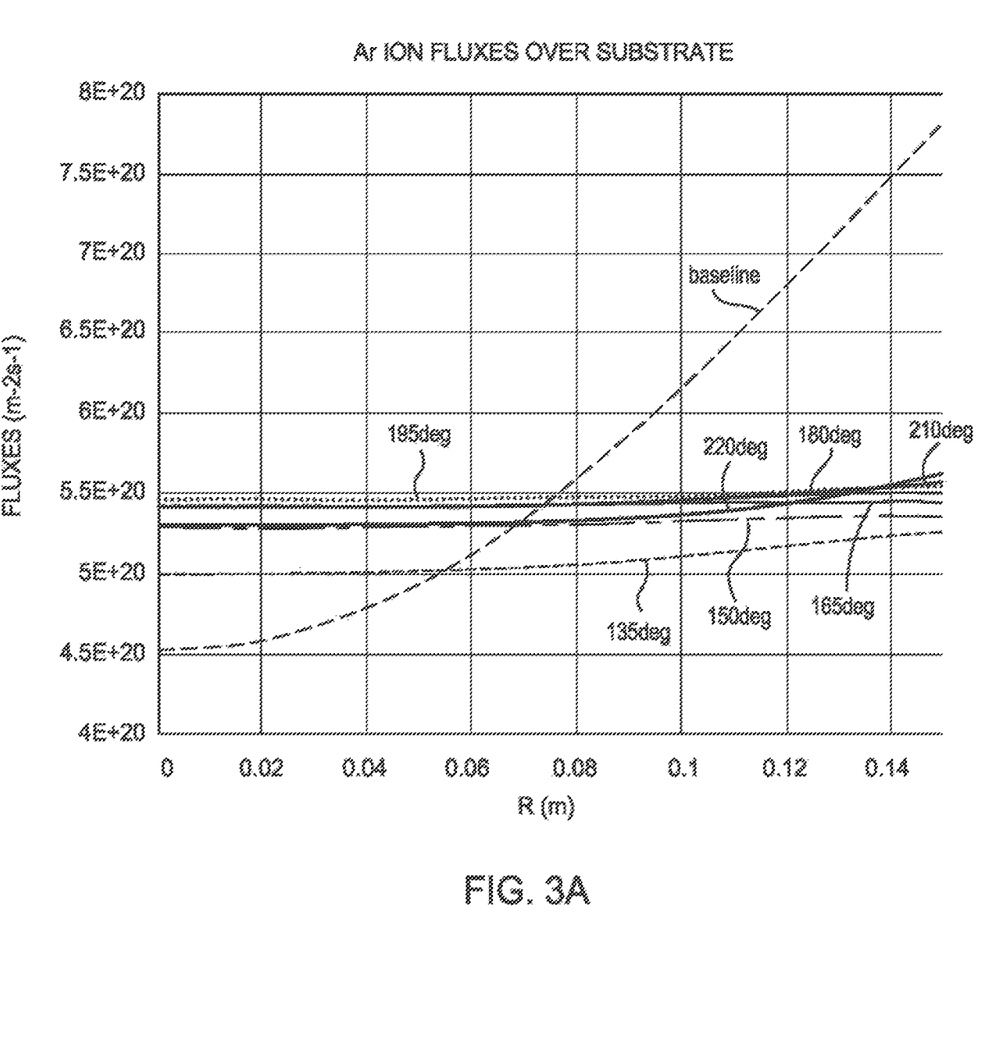
FIG. 3A is a chart depicting plasma flux profiles of argon ions with various phase differences of a powered faceplate according to one embodiment.

FIG. 3A is a chart depicting plasma flux profiles of argon ions with various phase differences of a powered faceplate. The chart in FIG. 3A depicts profiles of argon ions at various radii on a substrate 174 disposed in a process volume (illustrated in FIG. 1). The chart illustrates that adjusting the phase difference between the faceplate and the RF mesh can improve plasma uniformity throughout the process volume. For example, a baseline flux profile, in which the phase difference between the faceplate and the RF mesh is not controlled, has a argon ion flux between about $4.5 \times 10^{20}$ at a center of the substrate 174 being processed and about $7.5 \times 10^{20}$ at about 140 mm (0.14 m) from the center of the substrate 174. When the phase difference between the faceplate and the RF mesh is adjusted, the argon ion flux is substantially improved. For example, at a phase difference of 135°, the argon ion flux is between about $5 \times 10^{20}$ at a center of the substrate 174 and about 5.25×10^20 at about 140 mm from the center of the substrate 174.

The flux profiles illustrated in FIG. 3A are achieved in a process chamber as described with respect to FIG. 1A and FIG. 1B with a tuner circuit as described with respect to FIG. 2A at a frequency of about 13.56 MHz and a power of about 5 kW. While FIG. 3A depicts flux profiles of argon ions, it is contemplated that many other chemistries may be used to generate a plasma in the process volume for processing a substrate 174.

Figure 3B:
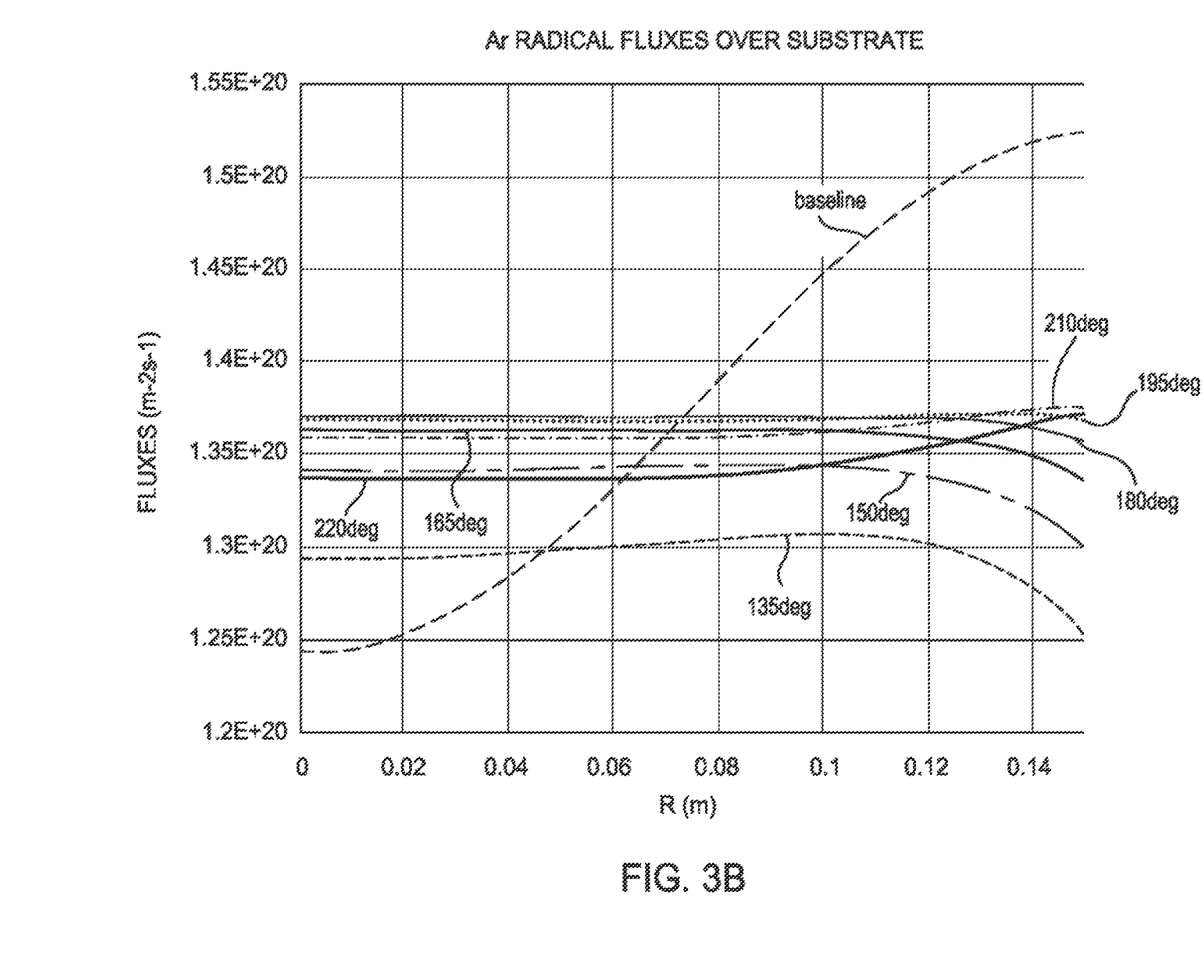
FIG. 3B is a chart depicting plasma flux profiles of argon radicals with various phase differences of a powered faceplate accordingly to one embodiment.

FIG. 3B is a chart depicting plasma flux profiles of argon radicals with various phase differences of a powered faceplate. The chart in FIG. 3B illustrates that controlling a phase difference between the faceplate and the RF mesh in a process chamber substantially improves a uniformity of argon radicals in a process volume. For example, a baseline flux profile, in which the phase difference between the faceplate and the RF mesh is not controlled, has an argon radical flux between about 1.24×10^20 at a center of the substrate 174 and about 1.52×10^20 at about 140 mm from the center of the substrate 174. At a phase difference of 165°, the argon radical flux is between about 1.37×10^20 at a center of the substrate 174 and about 1.35×10^20 at about 140 mm from the center of the substrate 174. Thus, adjusting the phase difference between the faceplate and the RF mesh substantially improves the uniformity of the plasma in the process volume.

The flux profiles illustrated in FIG. 3B are achieved in a process chamber as described with respect to FIG. 1A and FIG. 1B with a tuner circuit as described with respect to FIG. 2A at a frequency of about 13.56 MHz and a power of about 5 kW. While FIG. 3B depicts flux profiles of argon radicals, it is contemplated that many other chemistries may be used to generate the plasma in the process volume for processing a substrate 174 disposed therein.

Figure 4:
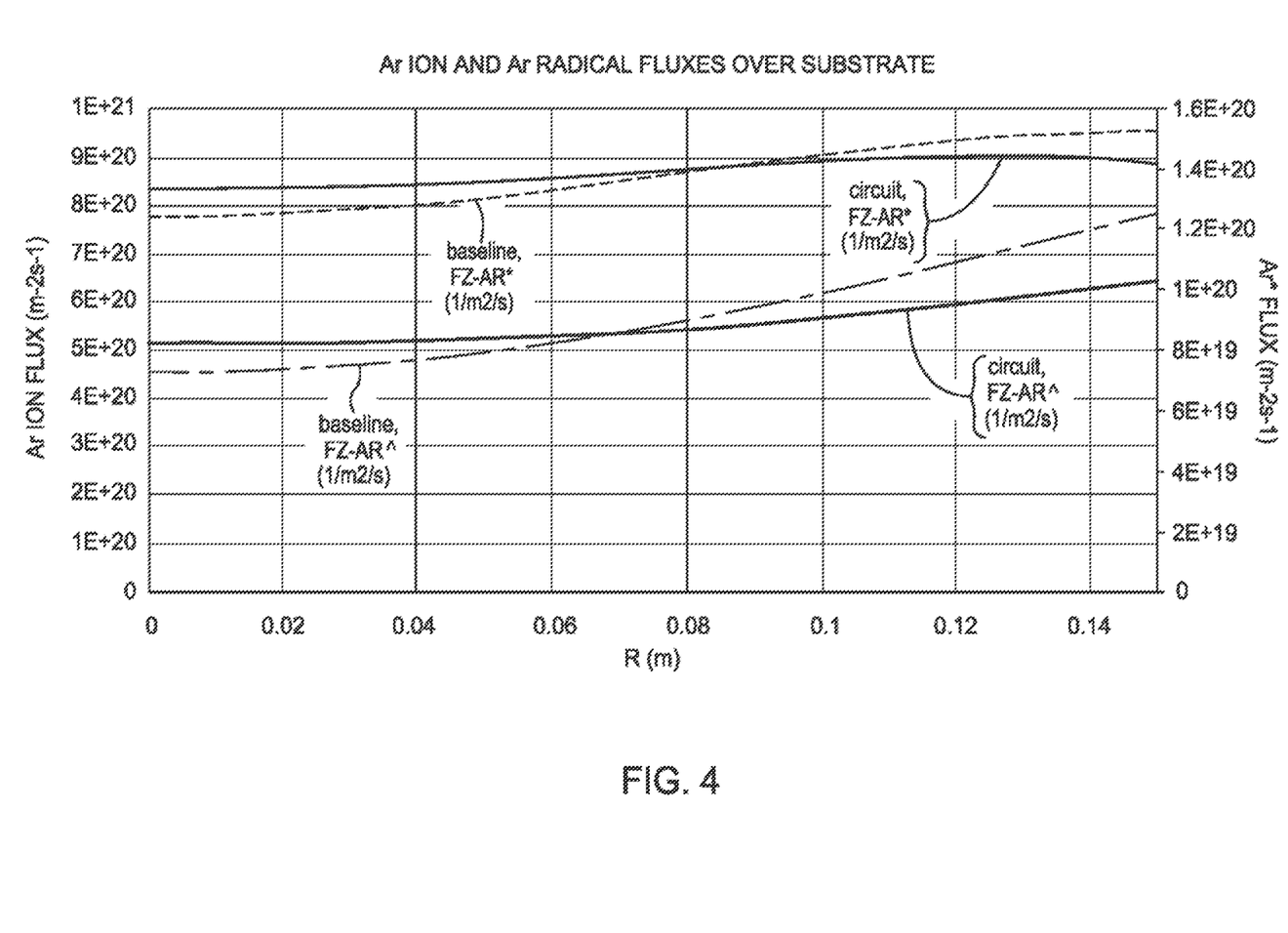
FIG. 4 is a chart depicting plasma flux profiles of argon ions and argon radicals with various phase differences of a passively floated faceplate according to one embodiment.

FIG. 4 is a chart depicting plasma flux profiles of argon ions and argon radicals with various phase differences of a passively floated faceplate. The chart in FIG. 4 depicts argon ion and radical flux profiles in a process chamber, such as the process chamber 100 depicted in FIG. 1A and FIG. 1B, with a floated faceplate via a tuner circuit, such as the tuner circuit 230 depicted in FIG. 2B.

Baseline ion and radical flux profiles are illustrated by the dashed lines. The baseline flux profiles are attained by generating a plasma in a process chamber such as the process chamber 100 illustrated in FIG. 1. The flux profiles illustrated by the solid lines are attained by generating a plasma in a process chamber with a tuner circuit (e.g., the tuner circuit 230 in FIG. 2B) coupled to the faceplate electrode. As shown, a range of the baseline ion and radical flux profiles (illustrated by dashed lines) is broader than a phase range when the tuner circuit is used to control the phase difference between the faceplate and the RF mesh.

Figure 5:
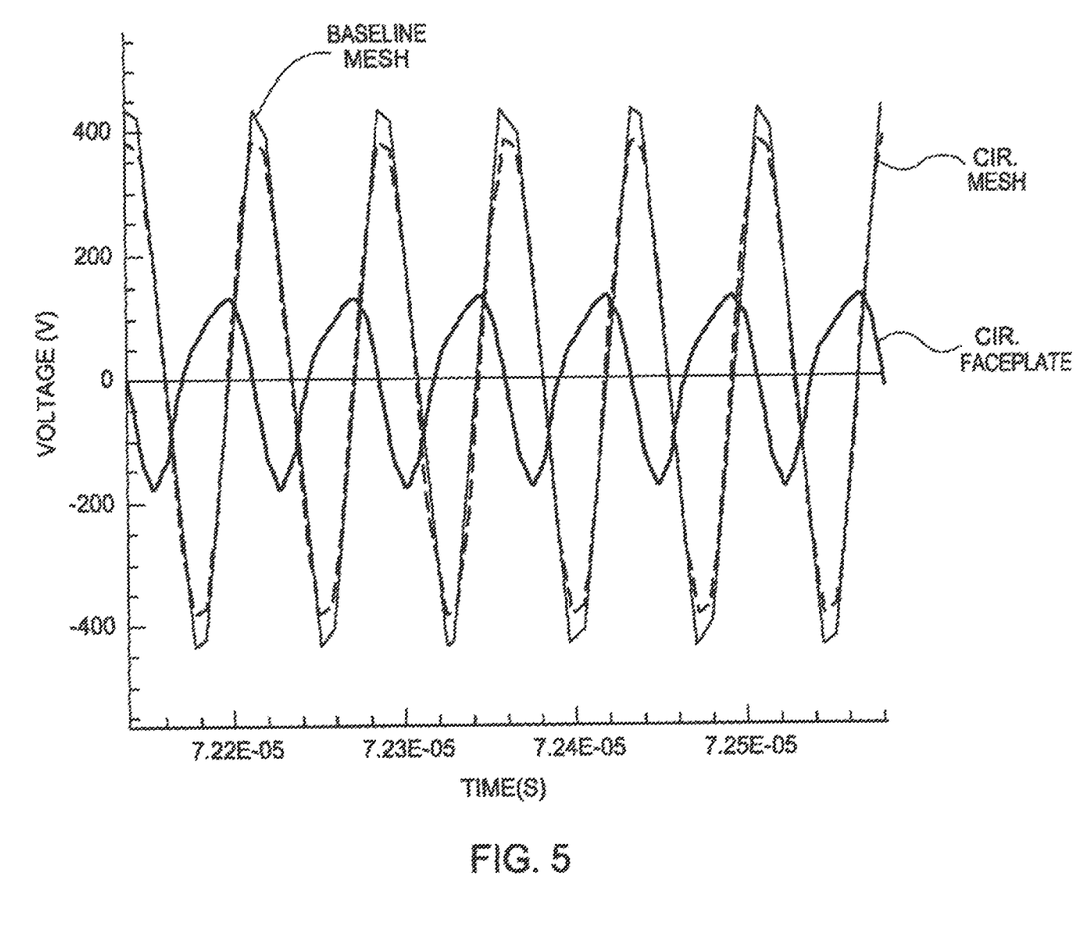
FIG. 5 is a chart depicting voltage profiles in a process chamber with a passively floated faceplate according to one embodiment.

FIG. 5 is a chart depicting voltage profiles in a process chamber with a passively floated faceplate. As illustrated, the RF power of the faceplate and the RF mesh is out of phase by about 220°. This phase difference is achieved in a process chamber such as the process chamber 100 described with respect to FIG. 1A and FIG. 1B and a tuner circuit such as the tuner circuit 230 in FIG. 2B coupled to the faceplate electrode.

The embodiments described herein provide apparatus and techniques to maintain or improve an efficiency of the RF power used to generate a plasma in the process volume. The embodiments described herein also substantially reduce an occurrence of parasitic plasma within the process chamber. Finally, the embodiments described herein provide improved plasma uniformity throughout the process volume.

While the foregoing is directed to embodiments of the present disclosure, other and further embodiments of the disclosure may be devised without departing from the basic scope thereof, and the scope thereof is determined by the claims that follow.

What is claimed is:

1. An apparatus, comprising:
a support pedestal having a support surface;
a conductive mesh disposed in the support pedestal;
a faceplate disposed opposite the support surface;
a process volume defined at least partially by the support pedestal and the faceplate;
a first portion of a grounding bowl having an annular shape and surrounding the support pedestal opposite the process volume;
a second portion of the grounding bowl disposed radially outward of the first portion and configured to move selectively into and out of contact with a pumping plate;
an annular liner surrounding the support pedestal and at least a portion of the first portion of the grounding bowl, the annular liner disposed in a recess of the pumping plate facing the process volume; and
a phase control circuit coupled to the faceplate and the conductive mesh.

2. The apparatus of claim 1, wherein the phase control circuit comprises:
a phase detector;
a feedback controller; and
a phase shifter.

3. The apparatus of claim 2, wherein the phase shifter comprises:
a variable capacitor; and
an inductor in parallel with the variable capacitor.

4. The apparatus of claim 1, further comprising:
a radio frequency (RF) generator;
a first amplifier coupled to the radio frequency generator and the faceplate; and
a second amplifier coupled to the radio frequency generator and the conductive mesh.

5. The apparatus of claim 1, further comprising:
a purge gap formed between the first portion of the grounding bowl and the second portion of the grounding bowl, at least a portion of the purge gap defined by the annular liner, wherein the annular liner is disposed between at least a portion of the second portion of the grounding bowl and the purge gap.

6. The apparatus of claim 5, wherein at least a portion of the purge gap is between the annular liner and the first portion of the grounding bowl.

7. The apparatus of claim 5, wherein the first portion of the grounding bowl comprises a stainless steel containing material and the second portion of the grounding bowl comprises an aluminum containing material.

8. An apparatus, comprising:
a support pedestal having a support surface;
a conductive mesh disposed in the support pedestal;
a faceplate disposed opposite the support surface;
a process volume defined at least partially by the support pedestal and the faceplate;
a first portion of a grounding bowl having an annular shape and surrounding the support pedestal opposite the process volume;
a second portion of the grounding bowl disposed radially outward of the first portion of the grounding bowl, the second portion of the grounding bowl configured to move selectively into and out of contact with a pumping plate;
a ledge formed into the second portion of the grounding bowl;
a purge gap formed between the first portion of the grounding bowl and the second portion of the grounding bowl adjacent to the support pedestal;
an annular liner surrounding the support pedestal and at least a portion of the first portion of the grounding bowl, the annular liner disposed in a recess of the pumping plate facing the process volume; and
a phase control circuit coupled to the faceplate and the conductive mesh.

9. The apparatus of claim 8, wherein the phase control circuit comprises:
a phase detector;
a feedback controller, wherein the feedback controller uses transmitted phase data from the faceplate and the conductive mesh; and
a phase shifter.

10. The apparatus of claim 9, wherein the phase shifter comprises:
a variable capacitor; and
an inductor in parallel with the variable capacitor.

11. The apparatus of claim 10, further comprising:
a radio frequency (RF) generator;
a first amplifier coupled to the radio frequency generator and the faceplate; and
a second amplifier coupled to the radio frequency generator and the conductive mesh.

12. The apparatus of claim 8, wherein at least a portion of the purge gap is between the annular liner and the first portion of the grounding bowl.

13. The apparatus of claim 12, wherein the first portion of the grounding bowl comprises a stainless steel containing material and the second portion of the grounding bowl comprises an aluminum containing material.

14. The apparatus of claim 8, wherein the annular liner comprises an aluminum oxide containing material.

* * * * *